United States Patent [19]

Howard et al.

[11] Patent Number: 5,347,258
[45] Date of Patent: Sep. 13, 1994

[54] ANNULAR RESISTOR COUPLED WITH PRINTED CIRCUIT BOARD THROUGH-HOLE

[75] Inventors: James R. Howard, Santa Clara; Gregory L. Lucas, Newark; Scott K. Bryan; Jin S. Choe, both of San Jose, all of Calif.

[73] Assignee: ZYCON Corporation, Santa Clara, Calif.

[21] Appl. No.: 44,301

[22] Filed: Apr. 7, 1993

[51] Int. Cl.5 ............................................. H01C 7/00
[52] U.S. Cl. ................................. 338/333; 338/306; 338/312; 338/311; 361/761
[58] Field of Search ............... 338/306, 307, 308, 309, 338/311, 314, 333; 156/630, 632; 361/761–766; 427/101, 102, 103

[56] References Cited

U.S. PATENT DOCUMENTS

| | | | |
|---|---|---|---|
| 2,443,018 | 6/1948 | Arvin et al. | 338/308 |
| 2,994,846 | 8/1961 | Quinn | 338/307 |
| 4,045,636 | 8/1977 | Yoder et al. | 200/292 |
| 4,130,857 | 12/1978 | Brower | 362/10 |
| 4,724,040 | 2/1988 | Iwasa | 338/309 X |
| 4,735,676 | 4/1988 | Iwasa | 338/308 X |
| 4,777,718 | 10/1988 | Henderson et al. | 308/312 X |
| 4,808,967 | 2/1989 | Rice et al. | 338/309 |
| 4,888,574 | 12/1989 | Rice et al. | 338/309 |
| 4,892,776 | 1/1990 | Rice | 428/209 |
| 4,911,796 | 3/1990 | Reed | 204/15 |
| 4,964,948 | 10/1990 | Reed | 156/659.1 |
| 5,039,570 | 8/1991 | Sturm | 428/209 |
| 5,100,695 | 3/1992 | Kawakami et al. | 427/96 |

*Primary Examiner*—Marvin M. Lateef
*Attorney, Agent, or Firm*—John A. Bucher

[57] ABSTRACT

A resistor and method of forming the resistor as an annular resistor body between a conductive pad surrounding a through-hole in the PCB and a surrounding conductive layer, the annular resistor body being formed from a conductive material having a selected resistivity, the outer and inner perimeters of the annular resistor body preferably being substantially constant radii whereby the operative resistance of the annular resistor body may be simply determined from the radii of its outer and inner perimeters, an effective thickness of the annular resistor body and its resistivity, the annular resistor body more preferably being formed from a liquid precursor facilitating formation of conductive interconnections at its outer and inner perimeters.

33 Claims, 3 Drawing Sheets

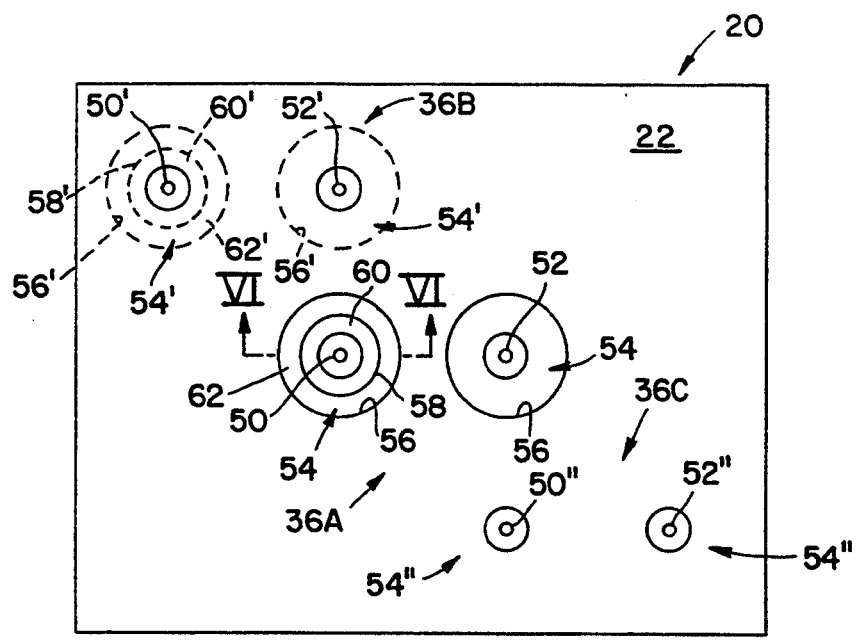
FIG. 5A
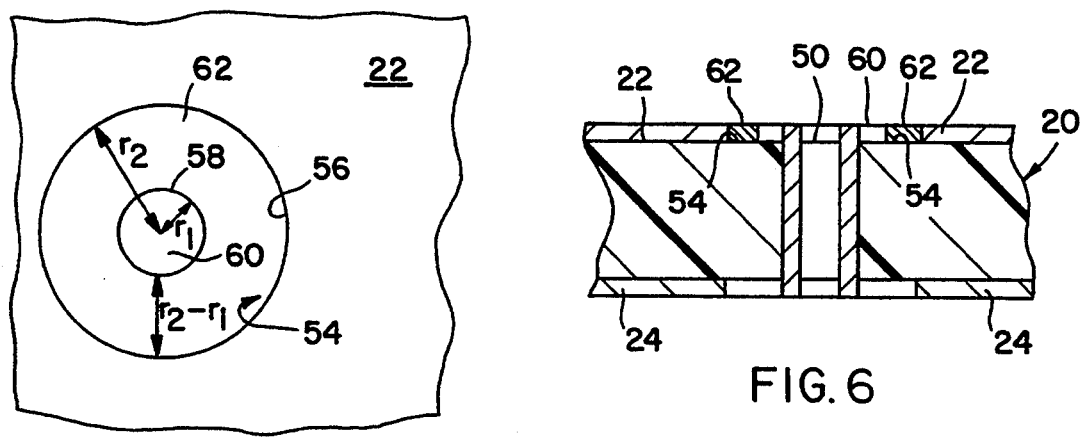
FIG. 5B
FIG. 6
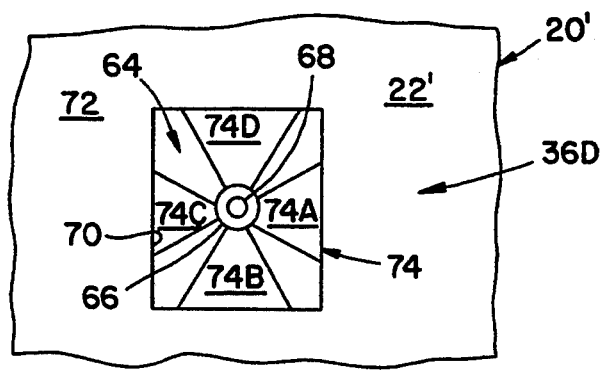
FIG. 7

ANNULAR RESISTOR COUPLED WITH PRINTED CIRCUIT BOARD THROUGH-HOLE

FIELD OF THE INVENTION

The present invention relates to printed circuit boards and more particularly to printed circuit boards including various devices or components to be coupled with individual resistors.

BACKGROUND OF THE INVENTION

The present invention is directed toward printed circuit boards (PCBs) and the like. These circuit boards typically include large numbers of electronic devices which are commonly surface mounted and also additional components which may be present in the form of active layers within each PCB. The requirements for the devices and components in such printed circuit boards are subject to conventional electronic design restraints.

More specifically, many of the surface mounted devices and other components on such PCBs commonly require coupling with individual resistors in order to achieve their desired function.

The most common solution to this problem in the prior art has been the use of individual resistors as additional surface mounted components on the PCBs. Design of the PCBs has further required the provision of through-holes in order to properly interconnect the resistors. In this regard, the resistors may be interconnected between any combination of surface devices or components or active components or layers formed on or within the PCBs.

Accordingly, the provision of such resistors has increased the complexity of the PCBs and at the same time either decreased the available surface area of the PCBs for other devices or else resulted in an overall increase in the size of the PCBs to accommodate necessary surface devices and components including resistors.

A more recent solution to this problem in the prior art has been the provision of planar resistors preferably formed on internal layers of the PCBs in order to replace prior art surface mounted resistors as described above while making surface portions of the PCBs free for other uses.

This concept involved the replacement of surface mounted or discrete resistors by resistors formed on layers arranged either on or within the PCBs.

Although such planar resistors provide advantages in certain applications over discrete surface mounted resistors, they have still tended to result in relative increases in the complexity and space demands on the PCBs. For example, if the planar resistors are formed on a surface layer of the PCB, it is of course possible to arrange an active surface device over the resistor. However, that surface portion of the PCB occupied by the planar resistor must be dedicated to the planar resistor itself. Accordingly, that portion of the board is not available for mounting pads, through-holes or the like. At the same time, it is also necessary to provide conductive couplings for interconnecting the surface formed planar resistors in order couple them with active devices or components in the PCBs. Here again, plated through-holes have commonly been employed for this purpose and further increase complexity and space demands in the PCBs.

Planar resistors of the type described above have also been formed on internal layers or planes of the PCBs. Such a configuration permits the use of standard subtractive PCB techniques, for example, to produce conductor patterns and resistor elements suited for high speed and high density circuit applications. However, even with the planar resistors being formed on internal layers of the PCBs, it is still necessary to provide plated through-holes or other conductors extending in a Z direction through the PCBs in order to provide the necessary couplings for the planar resistors with various surface mounted devices or components in the PCBs.

Accordingly, there has been found to remain a further need for improvements in the provision of resistors for various devices and components in PCBs.

SUMMARY OF THE INVENTION

It is accordingly an object of the present invention to provide an improved design for PCBs and the like including resistor elements of simplified design with reduced surface requirements on the PCBs.

It is particularly contemplated in connection with the present invention that the resistor elements be formed from generally conventional materials exhibiting either selected resistivity or conductivity. Accordingly, the resistance of each resistor element of the present invention is determined by its dimensions and the resistivity of the material from which it is formed.

However, it is a more particular object of the invention to provide a simplified design for the resistor elements of the present invention while reducing surface requirements within the PCB by forming the resistor elements of the present invention in combination with existing through-holes present in the PCBs for interconnecting surface devices or components with conductive layers on or in the PCB.

The term "through-hole" is employed in the present invention to refer to any Z directional conductor formed in the PCB for interconnecting a surface device or PCB component with a conductive layer on or in the PCB. For example, through-holes are commonly employed for interconnecting surface devices mounted on either surface of the PCB either with an internal conductive layer or plane within the PCB or even a conductive layer on the surface of the PCB. In the latter case, the most common arrangement would be a through-hole interconnecting a surface device on one side of the PCB with a conductive layer or plane on the opposite surface of the PCB. At the same time, through-holes of the type defined above are also employed for interconnecting surface mounted devices or components arranged on or in the PCB similarly with conductive layers or planes formed either on or in the PCB. Accordingly, the present invention specifically contemplates formation of its resistor elements in combination with any through-hole of the type defined above.

More specifically, it is an object of the invention to provide a resistor assembly in a PCB, the assembly including a conductive through-hole formed in the PCB for interconnection with a surface device or other PCB component, a conductive pad surrounding and conductively interconnected with the plated through-hole, a conductive layer surrounding and generally coplanar with the conductive pad and spaced apart from the conductive pad to form an annular recess, a resistor assembly being arranged in the annular recess and formed from a conductive material having a selected resistivity and outer and inner perimeters respectively conductively interconnected with the conductive layer and the conductive pad whereby the resistor assembly is electrically coupled along with the plated through-hole between the conductive layer and the surface device or component.

Broadly, the present invention contemplates such a resistor assembly or resistor assembly wherein the annular recess forms a continuous channel or separation between the conductive layer and the conductive pad or plated through-hole. At the same time, the resistor assembly is arranged in the annular recess and is preferably at least co-extensive with the annular recess. In such a co-extensive arrangement, the resistor assembly either extends just between the outer and inner perimeters or may even overlap the outer and inner perimeters are described in greater detail below.

It is a further related object of the invention to provide such a resistor assembly wherein the outer and inner perimeters of the resistor assembly are each formed with a substantially constant radius with the resistor assembly being at least generally coextensive with the annular recess whereby the operative resistance of the resistor assembly may be simply determined from the radii of its outer and inner perimeters, and effective thickness of the resistor assembly and its resistivity. It is even more preferably contemplated that the conductive layer and conductive pad have generally equal thicknesses at their respective interconnections with the resistor assembly for establishing the effective thickness of the resistor assembly. In this case, the resistor assembly is assumed to have a thickness approximately equal to those of the conductive layer and conductive pad.

Within such a configuration, the resistor assembly may readily be formed, for example, by deposition of a liquid precursor or by other methods of formation which will be apparent from the following description.

It is more broadly an object of the invention to provide such a resistor assembly at the juncture of a plated through-hole in a PCB with a surrounding conductive layer, the resistor assembly having an outer perimeter conductively interconnected directly with the conductive layer and an inner perimeter conductively interconnected with the plated through-hole. Here again, the outer and inner perimeters of the resistor assembly are preferably formed with substantially constant radii and the resistor is generally continuous between its outer and inner perimeters so that the operative resistance of the resistor assembly may be simply determined from the radii of its outer and inner perimeters, an effective thickness of the resistor assembly and its resistivity.

It is further contemplated in connection with the objects set forth above that the operative resistance of the resistor assembly or resistor assembly be capable of calculation in the manner summarized above. More specifically, a typical and preferred method for calculating the operative resistance of the resistor assembly or resistor assembly is set forth immediately below.

At least in a preferred embodiment of the present invention with the outer and inner peripheries of the resistor or resistor assembly having constant radii, the effective resistance of the resistor or resistor assembly may be determined as follows, having reference to FIG. 5B.

If R equals resistance, then it is well known that resistance may be calculated as $$R = \frac{pL}{wH}$$

where R equals resistance in ohms, p equals resistivity of the resistor in ohms centimeters, L equals the length of the resistor in centimeters, w equals the width of the resistor in centimeters and H equals the height of the resistor in centimeters (wH thus being the effective cross-sectional area of the resistor for purposes of calculating its resistance).

Referring now to FIG. 5B, the resistor body 62 is graphically illustrated with substantially constant radii forming its outer and inner peripheries 56 and 58. Further, since the resistor body 62 forms a resistor between the conductive pad 60 and the conductive layer or upper surface 18, then the effective length of the resistor body 62 is equal to the radial dimension of the resistor body, that is $r_2 - r_1$. The effective width of the resistor body is thus the mean circumference of the resistor body, that is the circumference of the resistor body generated from a point mid-way between the outer and inner peripheries 56 and 58. Thus, the effective width of the resistor body may be stated as follows:

$$W = 2\left[\frac{r_2 - r_1}{2} + r_1\right]\pi$$

These effective values for length and width may then be substituted into the basic equation set forth above for resistance. It may readily be seen from FIG. 5B that the overall resistance of the resistor body will be proportional to the differential radius, that is $r_2 - r_1$. At the same time, resistance is inversely proportional to the effective width of the resistor body as stated above.

The above equations can readily be employed for adjusting the radii of the outer and inner peripheries of the resistor body in order to provide any desired resistance, at least given the effective height (H) for the resistor body. It is also possible of course to permit variation of the effective height of the resistor body for purposes of determining overall resistance.

The equations set forth above thus readily facilitate the calculation of resistance relative to dimensions for a preferred embodiment of the resistor body as illustrated in FIG. 5B. At the same time, variations in the configuration of the resistor body may similarly be included in such mathematical determinations, but possibly with increased complexity relative to the equations set forth above.

The preceding summary is set forth with numerical labels described in greater detail below but set forth here for the purpose of facilitating application of the summarized equations with the preferred embodiment of FIG. 5B.

It is yet a further object of the invention to provide a method of forming a resistor assembly or resistor assembly of a type defined above wherein an annular recess is formed in a conductive layer of a PCB, a resistor assembly being formed in the annular recess from conductive material having a selected resistivity and an outer perimeter conductively interconnected with the conductive layer, a through-hole being formed in the PCB and plated with conductive material conductively interconnected with an inner perimeter of the resistor assembly. The order in which the steps are performed may be changed. For example, the through-hole could be formed prior to deposition of the resistor assembly in the annular recess. Here again, a conductive pad could also be formed about the plated through-hole for interconnection with the resistor assembly.

Additional objects and advantages of the invention are made apparent in the following description having reference to the accompanying drawings.

BRIEF DESCRIPTION OF THE DRAWINGS

FIG. 5A is a plan view of a capacitive laminate formed as a subassembly for inclusion in the PCB of FIG. 1 and illustrating, in greater detail, a resistor assembly formed according to the invention.

FIG. 5B is a fragmentary view of a single resistor body constructed according to the present invention and having a preferred configuration as also illustrated in FIG. 5A.

FIG. 6 is a fragmentary view taken along section lines VI—VI of FIG. 5A.

FIG. 7 is a fragmentary view illustrating a portion of a capacitive laminate similar to that illustrated in FIG. 5A to demonstrate another embodiment of the invention.

DESCRIPTION OF THE PREFERRED EMBODIMENTS

Figure 1:
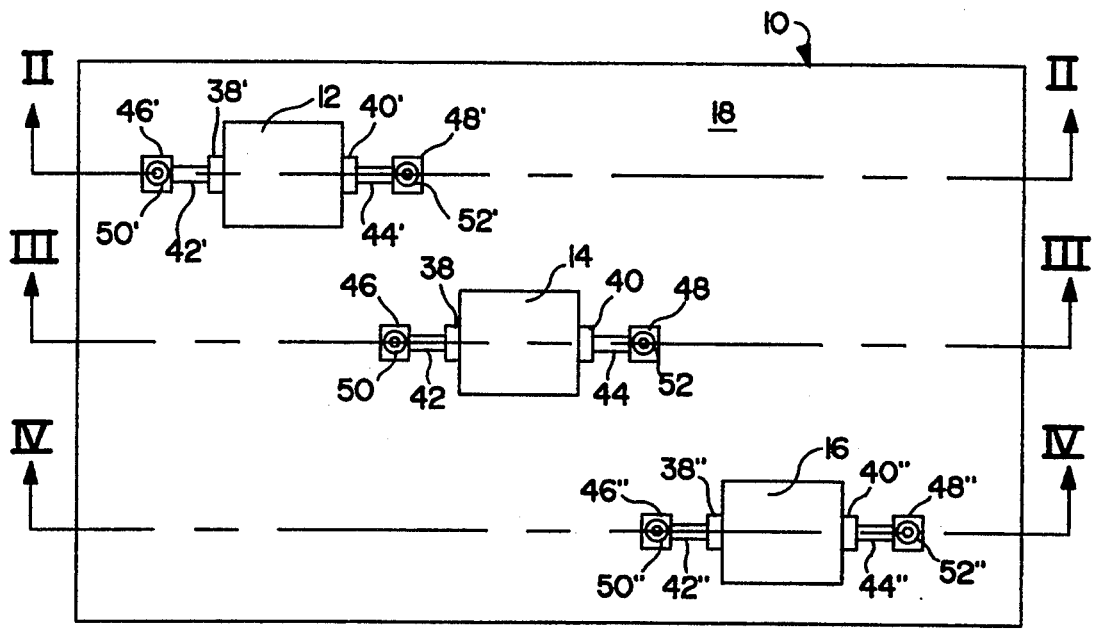
FIG. 1 is a plan view of a printed circuit board (PCB) with surface devices schematically illustrated for interconnection with various components of the PCB by respective through-holes.
Figure 2:
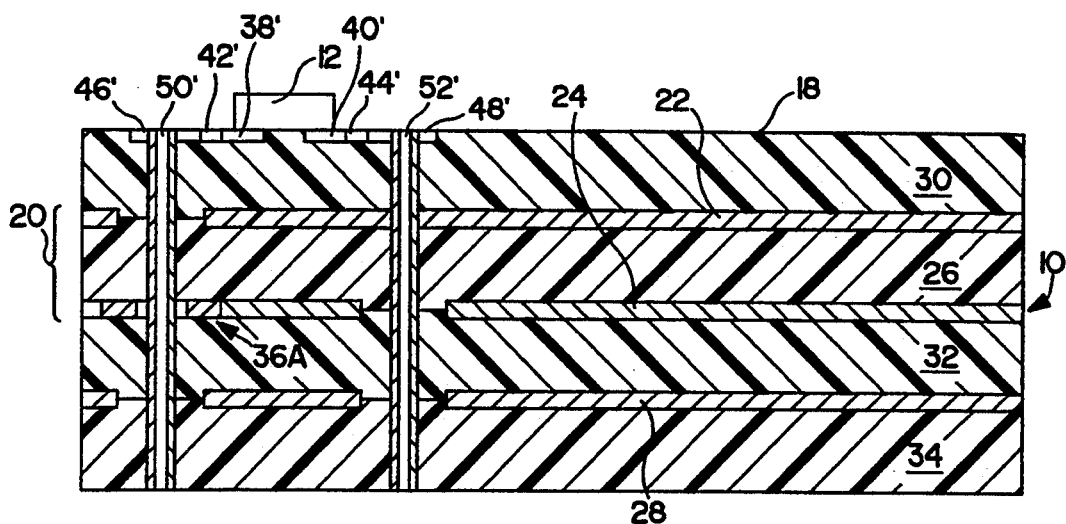
FIGS. 2, 3 and 4 are respectively view taken in section along section lines II—II, III—III and IV—IV of FIG. 1.
Figure 3:
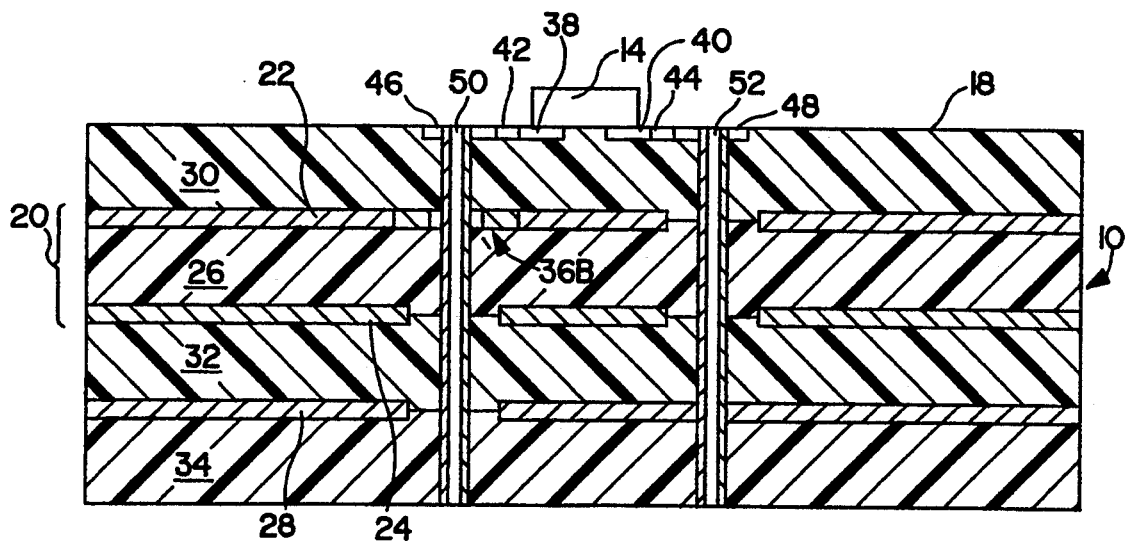
Figure 4:
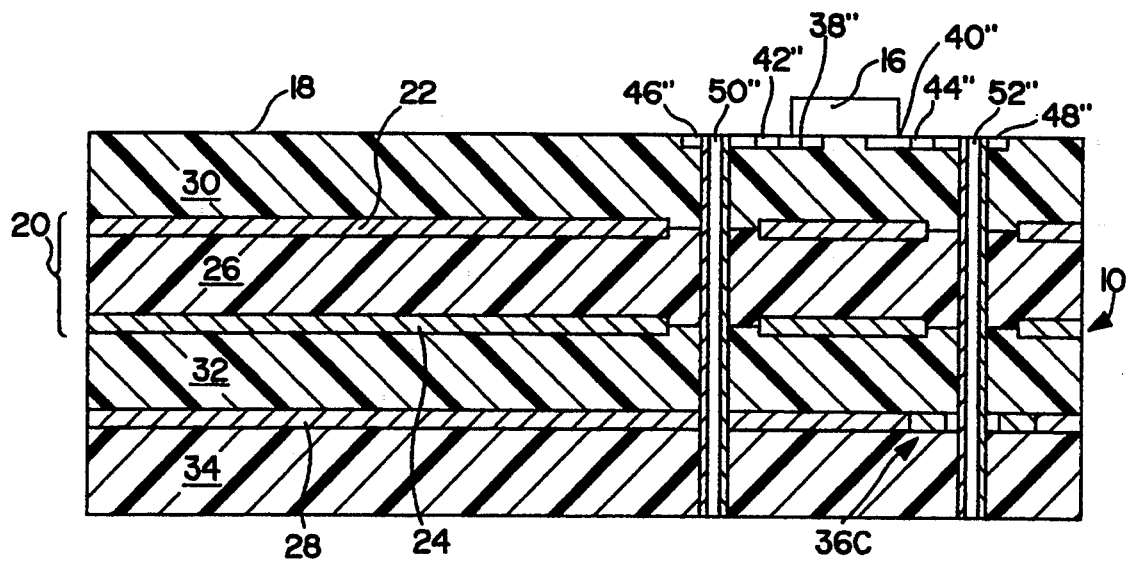

Referring now to the drawings and particularly to FIGS. 1-4, a printed circuit board (PCB) is generally indicated at 10 conventionally formed with multiple layers as described in greater detail below with reference to FIGS. 2-4. Surface mounted devices 12, 14 and 16 are arranged upon an upper surface 18 of the PCB for interconnection with conductive layers within the PCB as described in greater detail below.

Referring to FIGS. 2-4, the internal layers of the PCB include a capacitive laminate 20 formed from conductive foils or layers 22 and 24 arranged on opposite sides of a dielectric layer 26 formed for example form epoxy or from other materials having a higher dielectric constant. The conductive foil 22 is a power plane for the PCB 10 while the other conductive foil 24 is preferably a ground plane for the PCB. Such a higher dielectric constant could be provided for example by a layer of epoxy or other polymer filled with a material such as any of a variety of well known ceramics (not otherwise shown).

The PCB also includes another conductive layer or signal plane 28 and additional layers 30, 32 and 34 arranged on opposite sides of both the capacitive laminate 20 and the signal plane 28 to complete the PCB.

The PCB 10 is described only for purposes of example. The invention contemplates any of a variety of PCBs having any number of layers. As will be apparent from the following description, the invention also contemplates other devices or components in addition to the surface mounted devices 12, 14 and 16 which could be similarly interconnected with resistor bodies according to the present invention as described in greater detail below.

The surface devices 12, 14 and 16 are respectively interconnected with resistor assemblies 36A, 36B and 36C. The resistor assemblies are similarly configured but arranged in different conductive layers or planes of the PCB 10 as described in greater detail below.

The surface mounted device 12 is mounted on the surface 18 of the PCB 10 for example by mounting pads 38 and 40 which are respectively interconnected with signal traces 42 and 44.

The signal traces 42 and 44 are respectively interconnected with additional pads 46 and 48 respectively interconnected with plated through-holes 50 and 52.

Referring also to FIG. 2, the resistor assembly 36A surrounds and is conductively interconnected with the through-hole 50 while also being interconnected with the conductive or ground plane 24 of the capacitive laminate 20.

The other plated through-hole 52 can be interconnected with any portion or component of the PCB 10 depending upon the desired operation for the surface mounted device 12. Similar through-hole interconnections are provided for the surface mounted devices 14 and 16. Accordingly, the corresponding components of the surface mounting connections for those devices are indicated respectively by primed numerals and double-primed numerals otherwise corresponding to the through-hole connections described above for the surface mounted device 12.

Referring particularly to FIG. 3, the resistor assembly 36B is similarly constructed as the resistor assembly 36A illustrated in FIG. 2 but is interconnected with the conductive foil or power plane 22.

Similarly, referring particularly to FIG. 4, the resistor assembly 36C is also similarly constructed as the resistor assembly 36A while being arranged in conductive relation with the additional signal plane 28.

As illustrated in FIGS. 1-4, a resistor assembly constructed according to the present invention may be arranged at the intersection of any through-hole with any conductive plane or layer (or combination thereof) in a PCB or the like FIGS. 2 and 3 specifically illustrate resistor assemblies interconnected with either the power or ground planes 22 and 24 of a capacitive laminate. It will further be apparent from FIGS. 2 and 3 in combination with FIG. 1 that the surface devices 12 and 14 could thus be interconnected with both the respective resistor assemblies as well as the capacitive laminate by means of the same respective through-holes.

FIG. 4 illustrates that the resistor assembly could be arranged in other conductive layers of the PCB. It is also to be understood that those conductive layers could even be formed on one of the lateral surfaces of the PCB.

Furthermore, the resistor assemblies 36A, 36B and 36C of FIGS. 2-4 are generally illustrated at the intersection of through-holes formed in the PCB 10 for other purposes. More specifically, the through-holes illustrated in FIGS. 2-4 are generally contemplated for providing necessary electrical connections for the respective surface devices with various components within the PCB. In that case, the resistor assemblies 36A, 36B and 36C are merely added at the juncture of those pre-existing through-holes with selected conductive layers in the PCB.

At the same time, it is to be understood that a resistor assembly constructed according to the present invention could similarly be provided at the intersection of a through-hole and a conductive plane, such a through-hole specifically being provided for purposes of connection with the resistor assembly. In other words, the resistor assembly of the present invention is not to be limited to use with through-holes pre-existing in the PCB for other purposes.

The construction of the resistor assembly 36A is illustrated in greater detail in FIGS. 5A and 6. Here again, it is to be understood that the configuration of the resistor assemblies 36B and 36C is similar to that described below for resistor assembly 36A.

Referring now to FIGS. 5A and 6, the capacitive laminate 20 is illustrated as a component for inclusion in the PCB 10 of FIGS. 1-4. For that purpose, the conductive foils or power and ground planes 22 and 24 are initially laminated to the dielectric layer 26 in order to form the capacitive laminate 20 as a structurally self-supporting component.

In the capacitive laminate 20, the resistor assembly 36A is formed on the upper conductive foil or power plane 22. As noted above, the method of formation for the resistor assembly is particularly simple. At the same time, the method of formation for the resistor assembly of the invention makes it particularly easy to change the effective resistance for each resistor assembly as described in greater detail below.

Initially, an annular recess 54 is formed in the conductive foils or power plane 22 between an outer periphery 56 and an inner periphery 58. In addition, since the conductive foil 22 was originally in conductive relation with the through-hole 50, formation of the annular recess 54 also forms a conductive pad 60 between the inner periphery 58 and the plated through-hole 50.

Since the power plane 22 is formed from conductive material, it is thus a simple matter to etch the annular recess 54 at the same time that other circuit elements are etched into the conductive foil 22 as is conventional for a capacitive laminate in such a PCB.

A resistor body 62 is then arranged or formed in the annular recess 54 so that it is electrically interconnected with the power plane 22 and the conductive pad 60 at the outer and inner peripheries 56 and 58 respectively.

Preferably, the annular recess 54 is formed with its outer and inner peripheries 56 and 58 having constant radii and the conductive pad 60 having a similar thickness as the power plane 22, at least adjacent the inner and outer peripheries 58 and 56.

These features particularly simplify predetermination or calculation of the total resistance for the resistor body 62 from the respective radii for the outer and inner peripheries 56 and 58, the thickness of the power plane 22 (and accordingly the conductive pad 60) and the resistivity of material from which the resistor body 62 is formed. It is assumed that the thickness of the resistor body 62 is approximately equal to the thickness of the power plane 22 and the conductive pad 60.

FIG. 5B is provided to illustrate a simplified manner of calculation for determining the resistance of the resistor body 62 as described in greater detail below.

At least in a preferred embodiment of the present invention with the outer and inner peripheries of the resistor or resistor assembly having constant radii, the effective resistance of the resistor or resistor assembly may be determined as follows, having reference to FIG. 5B.

If R equals resistance, then it is well known that resistance may be calculated as $$R = \frac{pL}{wH}$$

where R equals resistance in ohms, p equals resistivity of the resistor in ohms centimeters, L equals the length of the resistor in centimeters, w equals the width of the resistor in centimeters and H equals the height of the resistor in centimeters (wH thus being the effective cross-sectional area of the resistor for purposes of calculating its resistance).

Referring now to FIG. 5B, the resistor body 62 is graphically illustrated with substantially constant radii forming its outer and inner peripheries 56 and 58. Further, since the resistor body 62 forms a resistor between the conductive pad 60 and the conductive layer or upper surface 18, then the effective length of the resistor body 62 is equal to the radial dimension of the resistor body, that is $r_2 - r_1$. The effective width of the resistor body is thus the mean circumference of the resistor body, that is the circumference of the resistor body generated from a point mid-way between the outer and inner peripheries 56 and 58. Thus, the effective width of the resistor body may be stated as follows:

$$W = 2\left[\frac{r_2 - r_1}{2} + r_1\right]\pi$$

These effective values for length and width may then be substituted into the basic equation set forth above for resistance. It may readily be seen from FIG. 5B that the overall resistance of the resistor body will be proportional to the differential radius, that is $r_2 - r_1$. At the same time, resistance is inversely proportional to the effective width of the resistor body as stated above.

The above equations can readily be employed for adjusting the radii of the outer and inner peripheries of the resistor body in order to provide any desired resistance, at least given the effective height (H) for the resistor body. It is also possible of course to permit variation of the effective height of the resistor body for purposes of determining overall resistance.

The equations set forth above thus readily facilitate the calculation of resistance relative to dimensions for a preferred embodiment of the resistor body as illustrated in FIG. 5B. At the same time, variations in the configuration of the resistor body may similarly be included in such mathematical determinations, but possibly with increased complexity relative to the equations set forth above.

The preceding summary is set forth with numerical labels described in greater detail below but set forth here for the purpose of facilitating application of the summarized equations with the preferred embodiment of FIG. 5B.

It may also be seen from the method of forming the resistor body 62 that its effective resistance may be predetermined simply by selecting the appropriate radii for the outer and inner peripheries 56 and 58. In other words, given the effective thickness of the resistor body and the resistivity of the material from which it is formed, the radii for the peripheries of the resistor body could then be selected in order to establish its effective resistance.

The resistor body is preferably formed from a liquid precursor such as a powdered resistor material suspended in a liquid. In this manner, the resistor body could be deposited and formed by conventional techniques if necessary or desired. However, it is to be understood that the resistor body could also be formed from other precursors either in liquid or paste or of other consistencies, even a dry film, for example.

Generally any liquid precursor may be employed for forming the resistor body as long as the precursor is capable of being filled or otherwise combined with a suitable resistor material either in the form of a powder or possibly larger particles. The precursor must also be selected so that it is capable of withstanding conventional PCB processing steps.

An example or examples of a particular liquid precursor suitable for use in the present invention may be taken for example from U.S. Pat. No. 4,870,746 issued Oct. 3, 1989 to Klaser under assignment to Litton Systems, Inc. The conductive or resistive inks described in that reference may also be used for forming the resistor body of the present invention. It is further to be noted that such conductive or resistive inks may be formed either as liquids capable of deposition by suitable silk-screen techniques of as a paste suitable for extrusion or planing to form the resistor body. Referring again to FIG. 5A, for example, such techniques are particularly adapted for forming the resistor body 62 in an annular recess such as that indicated at 54.

For purposes of the present disclosure, the above noted patent is incorporated herein by reference as though set forth in its entirety.

As noted above, the term "annular recess" is employed in a broadest sense to include other than simple round configurations. Referring for example to FIG. 7, a resistor assembly 36D could be formed as a replacement for any of the resistor assemblies 36A, 36B or 36C. As illustrated in FIG. 7, the resistor assembly 36D is formed with an annular recess 64 formed between an inner periphery 66 provided by a plated through-hole 68 and an outer periphery 70 adjacent a conductive plane 72. However, in the configuration of FIG. 7, the outer periphery 70 is rectangular.

At the same time, a resistor body 74 is formed by similar segments 74A–D arranged in conductive interconnection with both the inner and outer peripheries 66 and 70.

Thus, FIG. 7 illustrated that a resistor assembly can be formed according to the present invention with different configurations (or different geometric shapes forming the outer and inner peripheries) for the annular recess. The inner periphery of the recess can actually be formed by the plated through-hole itself as illustrated in FIG. 7. Calculation of the effective resistance for the resistor body 74 may be more complicated. However, design variations such as those illustrated in FIG. 7 may be desirable for employing the resistor assembly of the present invention in different applications.

Methods of forming the resistor assembly or resistor body of the present invention are believed clearly apparent from the preceding description of the invention. However, methods of formation are described below in order to assure a complete understanding of the invention.

Initially, referring for example to FIGS. 5A and 6, an annular recess is formed in a conductive plane, the annular recess having an outer periphery and an inner periphery such as those described above. Preferably, the inner periphery also defines a conductive pad. A through-hole may be formed axially within the conductive pad either prior to formation of the annular recess or after formation of the resistor body and even following its inclusion in a PCB such as that indicated at 10 in FIGS. 1–4.

Returning to the specific method, the resistor body is then formed in the annular recess. Preferably, the resistor body is at least co-extensive with the annular recess and preferably overlaps the outer and inner peripheries while at the same time being at least as thick as the conductive plane from which the annular recess was formed. As described above, this particularly simplifies determination of the effective resistance for the resistor body. With the resistor assembly thus being formed, the conductive plane including the resistor assembly is then laminated into the PCB or similar circuit board assembly as described above. As was also noted above, the necessary through-holes could be formed following completion of the PCB.

In any event, there has been described above different embodiments of a novel resistor assembly contemplated for arrangement at the intersection between a through-hole and a conductive plane in a PCB or the like. There has also been described at least one method of forming such a resistor assembly. The specific scope of the invention is accordingly defined only by the following claims which are further exemplary of the invention.

What is claimed is:

1. A resistor assembly in a printed circuit board (PCB), comprising
   a conductive through-hole in the PCB,
   a conductive pad surrounding and conductively interconnected with the through-hole,
   a conductive layer surrounding and generally co-planar with the conductive pad, the conductive layer being spaced apart from the conductive pad to form an annular recess, and
   a resistor body arranged in the annular recess and formed of a conductive material having a selected resistivity, the resistor body in the annular recess having an outer perimeter conductively interconnected with the conductive layer and an inner perimeter conductively interconnected with the conductive through-hole by means of the conductive pad.

2. The resistor of claim 1 wherein the outer and inner perimeters of the resistor body are each formed with a substantially constant radius and the resistor body is generally coextensive with the annular recess whereby the operative resistance of the resistor body may be simply determined from the radii of its outer and inner perimeters, an effective thickness of the resistor body and its resistivity.

3. The resistor assembly of claim 2 wherein the conductive layer and conductive pad have generally equal thicknesses at their respective interconnections with the resistor body for establishing the effective thickness of the resistor body.

4. The resistor assembly of claim 3 wherein the resistor body is formed from a liquid precursor facilitating formation of the conductive interconnection at its outer and inner perimeters with the conductive layer and conductive pad.

5. The resistor assembly of claim 4 wherein the conductive layer is a portion of a capacitive laminate in the PCB.

6. The resistor assembly of claim 1 wherein the conductive layer and conductive pad have generally equal thicknesses at their respective interconnections with the resistor body for establishing the effective thickness of the resistor body.

7. The resistor assembly of claim 1 wherein the resistor body is formed from a liquid precursor facilitating formation of the conductive interconnections at its outer and inner perimeters with the conductive layer and conductive pad.

8. The resistor assembly of claim 7 wherein the resistor body is generally coextensive with the annular recess.

9. The resistor assembly of claim 1 wherein the resistor body is generally coextensive with the annular recess.

10. The resistor assembly of claim 1 wherein the conductive layer is a portion of a capacitive laminate in the PCB.

11. A resistor arranged in a printed circuit board (PCB) at the juncture of a conductive through-hole and a conductive layer surrounding the resistor formed at the juncture of a conductive through-hole in a printed circuit board (PCB) with a surrounding conductive layer, comprising a resistor body of conductive material having a selected resistivity, an outer perimeter of said resistor of body conductively interconnected directly with the conductive layer and an inner perimeter of said resistor body operatively interconnected directly with the conductive through-hole.

12. The resistor of claim 11 wherein the outer and inner perimeters of the resistor body are each formed with a substantially constant radius and the resistor body is generally continuous between the outer and inner perimeters whereby the operative resistance of the resistor body may be simply determined from the radii of its outer and inner perimeters, an effective thickness of the resistor body and its resistivity.

13. The resistor of claim 11 further comprising a conductive pad conductively interconnected between the conductive through-hole and the inner perimeter of the resistor body.

14. The resistor of claim 13 wherein the outer and inner perimeters of the resistor body are each formed with a substantially constant radius and the resistor is generally continuous between the outer and inner perimeters.

15. The resistor of claim 14 wherein the conductive layer and conductive pad have generally equal thicknesses at their respective interconnections with the resistor body for establishing the effective thickness of the annular resistor body.

16. The resistor of claim 15 wherein the resistor body is formed from a liquid precursor facilitating formation of the conductive interconnection at its outer and inner perimeters with the conductive layer and conductive pad.

17. The resistor of claim 16 wherein the liquid precursor is a compound.

18. The resistor of claim 11 wherein the conductive layer is a portion of a capacitive laminate in the PCB.

19. The resistor of claim 11 wherein the annular resistor body is formed from a liquid precursor facilitating formation of the conductive interconnection at its outer and inner perimeters with the conductive layer and conductive through-hole.

20. The resistor of claim 19 wherein the resistor body is generally continuous between the outer and inner perimeters.

21. The resistor of claim 11 wherein the resistor body is generally continuous between the outer and inner perimeters.

22. The resistor of claim 11 wherein the outer perimeter of the annular resistor body has a substantially constant radius.

23. A method of forming a resistor in a conductive layer of a printed circuit board (PCB), comprising the steps of
   forming an annular recess in the conductive layer,
   forming a resistor body in the annular recess, the resistor body being a conductive material having a selected resistivity and an outer perimeter conductively interconnected with the conductive layer, and
   forming a conductive through-hole in the annular recess, the through-hole being conductively interconnected with an inner perimeter of the resistor body.

24. The method of claim 23 further comprising the step of forming the outer and inner perimeters of the resistor body with substantially constant radii and forming the resistor body to be generally coextensive with the annular recess whereby the operative resistance of the annular resistor body may be simple determined from the radii of its outer and inner perimeters, an effective thickness of the resistor body and its resistivity.

25. The method of claim 23 further comprising the step of forming a conductive pad conductively interconnected between the conductive through-hole and the inner perimeter of the resistor body formed within the annular recess.

26. The method of claim 25 further comprising the step of forming the outer and inner perimeters of the resistor body with substantially constant radii and forming the resistor body to be generally coextensive with the annular recess whereby the operative resistance of the resistor body may be simply determined from the radii of its outer and inner perimeters, an effective thickness of the resistor body and its resistivity.

27. The method of claim 26 further comprising the step of forming the conductive layer and conductive pad with generally equal thicknesses at their respective interconnections with the resistor body for establishing the effective thickness of the resistor body.

28. The method of claim 27 further comprising the step of forming the resistor body from a liquid precursor facilitating formation of the conductive interconnections at its outer and inner perimeters with the conductive layer and conductive through-hole.

29. The method of claim 23 wherein the conductive layer is a portion of a capacitive laminate in the PCB.

30. The method of claim 23 further comprising the step of forming the annular resistor body from a liquid precursor facilitating formation of the conductive interconnections at its outer and inner perimeters with the conductive layer and conductive through-hole.

31. The method of claim 30 wherein the resistor body is generally coextensive with the annular recess.

32. The method of claim 23 wherein the resistor body is generally coextensive with the annular recess.

33. The method of claim 23 further comprising the step of forming the outer perimeter of the resistor body with a substantially constant radius.

* * * * *

UNITED STATES PATENT AND TRADEMARK OFFICE
CERTIFICATE OF CORRECTION

PATENT NO. : 5,347,258
DATED : September 13, 1994
INVENTOR(S) : James R. Howard, et al.

It is certified that error appears in the above-indentified patent and that said Letters Patent is hereby corrected as shown below:

In column 6, line 41, after "like", insert —.—.

In column 11, line 20, delete "formed at the juncture of a conductive through-hole in a printed circuit board (PCB) with a surrounding conductive layer".

In column 11, line 25, after "resistor" delete "of".

In column 5, line 47, after "formed" insert --,--.

In column 5, line 47, delete "form" and insert therefor --from--.

Signed and Sealed this

Third Day of January, 1995

*Attest:*

BRUCE LEHMAN

*Attesting Officer*      *Commissioner of Patents and Trademarks*